(12) United States Patent
Hata (10) Patent No.: US 7,354,860 B2
(45) Date of Patent: Apr. 8, 2008

(54) MANUFACTURING METHOD OF MASK BLANK AND MANUFACTURING METHOD OF TRANSFER MASK

(75) Inventor: Mitsuaki Hata, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 271 days.

(21) Appl. No.: 10/544,988

(22) PCT Filed: Mar. 31, 2004

(86) PCT No.: PCT/JP2004/004604

§ 371 (c)(1),
(2), (4) Date: Sep. 2, 2005

(87) PCT Pub. No.: WO2004/088420

PCT Pub. Date: Oct. 14, 2004

(65) Prior Publication Data

US 2006/0057470 A1    Mar. 16, 2006

(30) Foreign Application Priority Data

Mar. 31, 2003 (JP) .............................. 2003-097089

(51) Int. Cl.
*H01L 21/302* (2006.01)
(52) U.S. Cl. ........................ 438/689; 438/745
(58) Field of Classification Search ............ 438/689, 438/745, 753, 754, 755, 756; 430/5; 134/1.3, 134/6; 216/83
See application file for complete search history.

(56) References Cited

U.S. PATENT DOCUMENTS

| 4,113,492 | A | | 9/1978 | Sato et al. |
| 6,165,552 | A | * | 12/2000 | Anai et al. .................. 427/240 |
| 6,261,378 | B1 | * | 7/2001 | Hashimoto et al. ............ 134/6 |
| 6,432,199 | B1 | * | 8/2002 | Takekuma .................... 118/52 |
| 6,432,620 | B1 | * | 8/2002 | Arao .......................... 430/322 |
| 6,682,607 | B1 | * | 1/2004 | Farino ......................... 134/26 |
| 2002/0155392 | A1 | * | 10/2002 | Arao .......................... 430/329 |
| 2003/0008066 | A1 | * | 1/2003 | Yoshihara et al. ........... 427/240 |
| 2003/0022515 | A1 | * | 1/2003 | Nakagawa ................... 438/734 |
| 2003/0180471 | A1 | * | 9/2003 | Takehuma et al. ........... 427/421 |
| 2003/0190534 | A1 | * | 10/2003 | Kobayashi et al. ............ 430/5 |

FOREIGN PATENT DOCUMENTS

| JP | B2 58-193520 | 4/1983 |
| JP | A 63-086433 | 4/1988 |
| JP | A 63-190679 | 8/1988 |
| JP | A 06-262124 | 9/1994 |
| JP | A 07-020623 | 1/1995 |
| JP | A 2001-259502 | 9/2001 |
| JP | A 2003-173019 | 6/2003 |

\* cited by examiner

*Primary Examiner*—Kin-Chan Chen
(74) *Attorney, Agent, or Firm*—Oliff & Berridge, PLC (57) ABSTRACT

A manufacturing method of a mask blank from which an unnecessary resist film formed on the peripheral edge of a substrate main surface is removed in a mask blank, which is an original substrate of a transfer mask having a transfer pattern for transferring to a body to be transferred on a substrate, and a manufacturing method of a transfer mask using the mask blank.

11 Claims, 7 Drawing Sheets

MANUFACTURING METHOD OF MASK BLANK AND MANUFACTURING METHOD OF TRANSFER MASK

TECHNICAL FIELD

The present invention relates to a manufacturing method of a mask blank from which an unnecessary resist film formed on the peripheral edge of a substrate main surface is removed in a mask blank, which is an original substrate of a transfer mask having a transfer pattern for transferring to a body to be transferred on a substrate, and a manufacturing method of a transfer mask using the mask blank.

BACKGROUND ART

In a manufacturing step of a mask blank, particularly the mask blank, which is an original substrate of a transfer mask formed with a transfer pattern becoming a pattern of an electronic circuit on a substrate, after a resist film is formed on a substrate surface forming the mask blank, the substrate passes through various kinds of processing steps in which it is held by a carrying mechanism or inserted/removed into/from a substrate housing case. At this time, the peripheral edge of the substrate forming the mask blank comes into contact with a chuck part of the carrying mechanism and a housing groove of the housing case, and the resist film on the peripheral edge of the substrate is peeled to become a dust generation source. Accordingly, a problem is that the peeled resist adheres to a main surface of the mask blank, resulting in a defect.

Therefore, when manufacturing the mask blank, the substrate is subjected to processing in such a manner that by spin-coating the resist thereon to form the resist film, and thereafter the resist film on the peripheral edge of the substrate is previously removed. In the processing, a chemical liquid by which the resist is dissolved is fed to the resist on the peripheral edge of the substrate while rotating the substrate horizontally around a specified rotation center, and the resist film on the peripheral edge of the substrate is thereby dissolved and removed.

For example, a technique to remove the unnecessary resist film on the peripheral edge of the substrate includes a method disclosed in Patent Document 1.

The method of removing the unnecessary films comprising: forming the resist film by the spin-coating method, covering the surface of the substrate with a cover member formed with a plurality of fine holes on the peripheral edge of the substrate (part located in the upper part of the unnecessary film to be removed), and feeding the chemical liquid (solvent) by which the resist is dissolved from above this cover member, while the substrate and the cover member are integrally rotated. The solvent thus fed is fed to the peripheral edge of the substrate through the fine holes, and the resist formed on the peripheral edge of the substrate is thereby dissolved and removed.

(Patent Document 1)
Japanese Patent Laid Open No. 2001-259502

DISCLOSURE OF THE INVENTION

However, when dissolving and removing the resist formed on the peripheral edge of the substrate by the unnecessary film removing method described in Patent document 1, it is found that build-ups are generated on the sectional face of the resist film, or a resist residue is generated according to the kind of the resist. It is also found that the removed width of the resist film is larger in the corner parts and different along the sides of the substrate, resulting in high variations in removed width.

Regarding this phenomena, explanation will be given with reference to the drawings.

Figure 7:
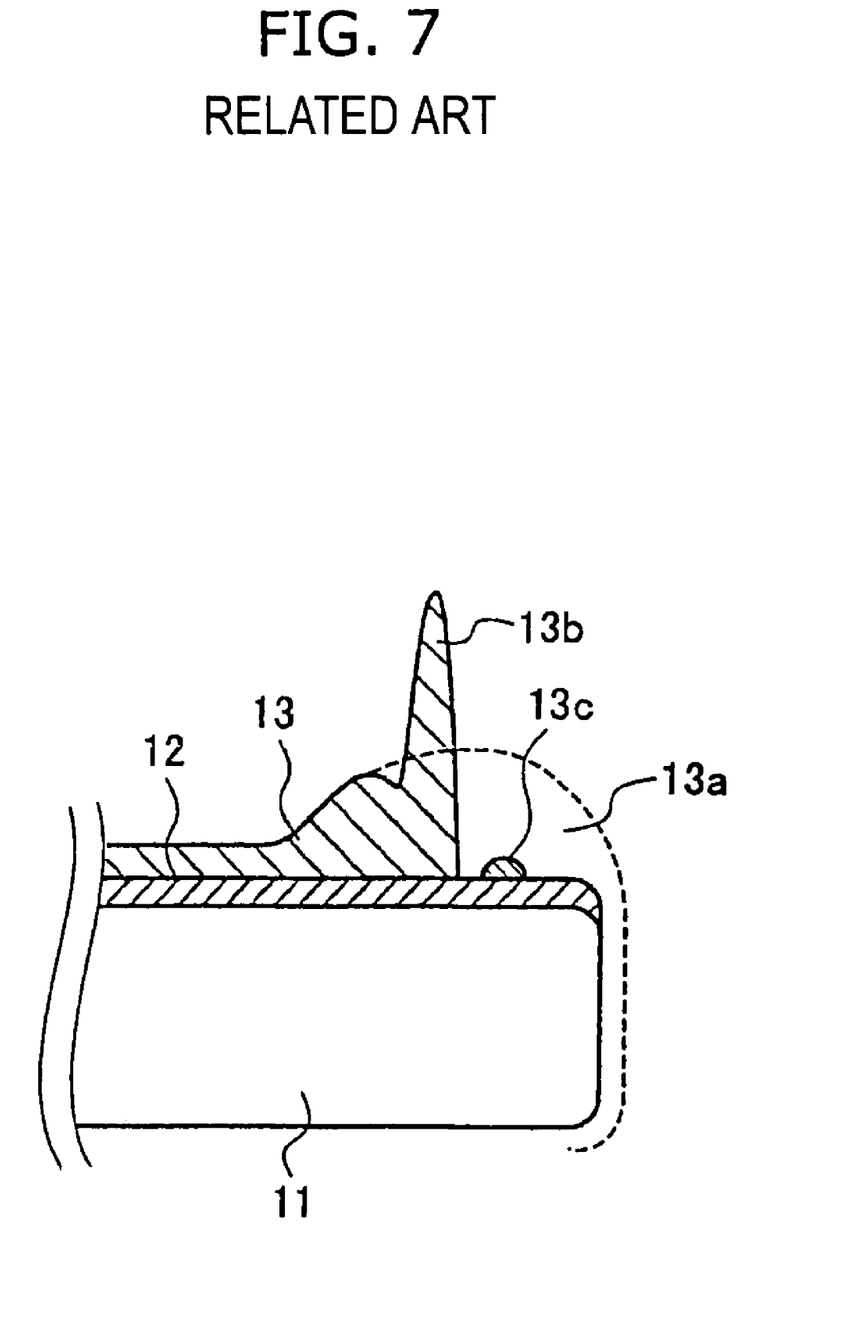
FIG. 7 is an enlarged view of an end portion of a mask blank obtained when the unnecessary film is removed by the conventional technique.

FIG. 7 is an enlarged view of an end portion of a mask blank obtained when removing the unnecessary film by the conventional technique.

In FIG. 7, designation mark 11 designates a light-transmitting substrate, mark 12 designates a light-shielding film or an opaque film, and mark 13 designates a resist film. Further, mark 13a designates the unnecessary resist film, mark 13b designates the build-up part, and mark 13c designates the resist residue.

As shown in FIG. 7, it is found that after removing the resist film 13a of the unnecessary film formed on a substrate 11 by a solvent, the build-up 13b is generated or the resist residue 13c is remained in the sectional face of the resist film remained after removing the resist on the peripheral edge of the substrate 11. Also, it is found that the above-described phenomena is observed when the resist film on the peripheral edge of the substrate is removed, while covering the surface of the substrate on the side formed with the resist film with a cover member. Particularly, when the build-up 13b exists as shown in FIG. 7, as described above, the problem is that when inserting/removing the mask blank into/from the substrate housing case, the resist film is peeled to become a dust source, or when the area of the build-up 13b is formed wider toward the center of the substrate 11, a pattern gets blurred when patterning an alignment mark, etc., in the vicinity of the peripheral edge of the substrate. In addition, the problem is that when the height of the build-up 13b is large, the pattern near the peripheral edge of the substrate (for example, the alignment mark or a quality assurance pattern) becomes defective, and therefore in order to prevent the defective pattern, the resist film requires exposure plural times, thereby complicating a patterning step.

Moreover, in Patent Document 1, the variations in the removed width of the resist film are large. The reason is considered such that in a process of dissolving and removing the unnecessary resist film by the solvent, since the substrate has a rectangular shape (rectangular shape including a parallelpiped shape and a square shape), removing force by rotation applied on the dissolved resist is different between the corner parts of the substrate and the parts other than the corner parts. Therefore, the problem arises such that an auxiliary pattern such as an alignment mark near the peripheral edge of the substrate is defective depending on circumstances.

However, an exposure light source wavelength such as i beam (365 nm of wavelength) is longer compared with the beams of today when using the transfer mask, and the line width variation quantity of the mask pattern to be formed is larger compared with that of today. Therefore, the allowable defect decision level is not set so strict, and a mask pattern forming area is relatively small. Accordingly, the auxiliary pattern such as the alignment mark is formed closer to the center from the peripheral edge of the substrate, thereby not particularly involving problem regarding the above-described resist residues, build-ups, and variations in removed width. However, in recent years, as the exposure light source wavelength is made shorter, the pattern is made finer, and the mask pattern forming area is made larger, the allowable defect decision level is set more strict. Also, by forming the auxiliary pattern such as an alignment mark at a part near the side face of the substrate, a problem is generated.

Therefore, in view of the above-described circumstances, the present invention is provided. A first object of the present invention is to provide a manufacturing method of a mask blank capable of suppressing variations in removed width after removing a resist film on the peripheral edge of a substrate even when any kind of resist is used. A second object of the present invention is to provide a manufacturing method of a mask blank capable of suppressing build-ups, free of resist residues, further capable of suppressing variations in removed width, after removing the resist film on the peripheral edge of the substrate and thereby preventing the defect caused by re-adhesion of the dissolved resist. A third object of the present invention is to provide a manufacturing method of a transfer mask free of pattern defects generated in patterns such as an alignment mark and a QA pattern (quality assurance pattern), and an auxiliary pattern such as a bar code pattern formed near the peripheral edge of the substrate.

The present invention requires the following structure, so as to solve the above-described problems.

(Structure 1) There is provided a manufacturing method of a mask blank, comprising:

preparing a rectangular-shaped substrate formed with a thin film becoming a transfer pattern to be transferred to a body to be transferred, and formed with a resist film by coating a resist liquid on the thin film and drying it;

removing an unnecessary resist film formed in a resin-removed area provided in the peripheral edge of a main surface of the substrate by using a chemical liquid;

heating the resist film formed in a non-resin-removed area, which is a main surface of the substrate and an area other than the resin-removed area;

wherein a cover member is fitted to the surface of the substrate on the side formed with the resist film in a separated state at a designated distance from the main surface of the substrate in the resin-removed area, further the substrate is rotated at a prescribed rotation speed R1, and after dissolving the unnecessary resist film by feeding the chemical liquid to the gap, the chemical liquid is stopped to be fed thereto, and further, the substrate is rotated at a higher revolution than the prescribed rotation speed, thereby removing the dissolved unnecessary resist film outside the substrate and drying it, wherein the revolution of the substrate when the dissolved unnecessary resist film is removed outside the substrate and the area from which the resist film is removed is dried, is set to be rotation speed R2 at which the substrate is rotated and the variations in removed width of each side of the substrate are suppressed, the variation being caused by the difference in centrifugal force applied on the dissolved resist film in a direction along each side of the peripheral edge of the main surface of the substrate, and thereafter, the substrate is rotated at a prescribed rotation speed R3 so as to dry the area from which the resists film is removed.

When the unnecessary resist film dissolved by chemical liquid is removed outside the substrate and dried, since the substrate has a rectangular shape, the centrifugal force by rotation is larger at the corner parts in the peripheral edge of the main surface of the substrate, and smallest in the center of each side of the substrate. Accordingly, the removing speed of the resist film dissolved in the corner parts is made accelerated, thereby generating variations in removed width in such a way that the removed width is larger in the corner parts, and the removed width becomes smaller as it is closer to the center of each side from the corner parts. By suppressing the acceleration of the removing speed of the resist film dissolved in the corner parts, and after removing the resist film dissolved to some degree by rotating the substrate at a prescribed rotation speed R2 by which the variations in removed width can be suppressed, by rotating the substrate at a prescribed rotation speed R3 so as to dry the area from which the resist film is removed, the mask blank capable of suppressing variations in removed width is obtained.

(Structure 2) There is provided the manufacturing method of the mask blank according to Structure 1, wherein the resist liquid contains at least any one of diethylene glycol dimethyl ether, anisole, methyl cellosolve acetate, and cyclohexanone as the solvent, and rotation speeds R1, R2, and R3 are set under the conditions of:

$$R1=100 \text{ to } 500 \text{ rpm} \tag{I}$$

$$R2 \geq 300 \text{ rpm} \tag{II}$$

$$R1 < R2 \leq R3 \tag{III}$$

As the resist liquid containing at least any one of diethylene glycol dimethyl ether, anisole, methyl cellosolve acetate, and cyclohexanone as the solvent, generally high-molecular-weight resist is given as an example. However, generally the viscosity of the resist (raw liquid) is above 10 cp (in some cases, above 40 cp), which is a high value, and therefore it is difficult to be dissolved by chemical liquid (slow in dissolving speed). Accordingly, for the chemical liquid to successfully permeate into every gap without surrendering to the centrifugal force by rotation, the rotation speed R1 of the substrate in the dissolving step of the high-molecular-weight resist is preferably set to be low compared with the resist of structure 4 as will be described later.

However, if the rotation speed R1 of the substrate in the dissolving step is set to be too low, the centrifugal force by rotation is weak, thereby allowing the chemical liquid to permeate into the center of the substrate to form a swelling part of resist, thus forming the build-up parts. However, if the rotation speed R1 of the substrate is set to be too high, by surrendering to the centrifugal force by rotation, the chemical liquid can not be successfully permeated into every gap, and therefore the resist formed on the peripheral edge of the substrate can not be completely dissolved.

Above-described points are taken into consideration, and when the resist contains the above-described solvents, the rotation speed R1 of the substrate is set to be:

$$R1=100 \text{ to } 500 \text{ rpm}. \tag{I}$$

In addition, if the rotation speed R2 is set to be too low, the dissolved resist is allowed to permeate into the center of the substrate, thereby forming the build-ups by swelling of the resist, or the dissolved resist remains without being removed outside the substrate, thereby forming the resist residue.

Accordingly, when the resist contains the above-describe solvents, the rotation speed R2 of the substrate is set to be:

$$R2 \geq 300 \text{ rpm}. \tag{II}$$

In addition, with respect to the rotation speed R1 of the substrate, the rotation speed R2 of the substrate, and the rotation speed R3 of the substrate, R2 needs to be higher than R1 from a point that the resist dissolved by chemical liquid is not allowed to be kept in the peripheral edge of the substrate, but removed outside the substrate. Also, R3 may be equal to R2 or more from the point of preventing the dissolved resist remained without being completely removed outside the substrate, from permeating into the center of the substrate. Therefore, in view of the above points, the rotation speed R1 of the substrate, the rotation speed R2 of the substrate, and the rotation speed R3 are set to be:

$$R1<R2\leq R3 \quad (III)$$

(Structure 3) There is provided the manufacturing method of the mask blank according to structure 2, wherein the rotation speed R2 is set to be R2=300 to 600 rpm.

By setting the rotation speed R2 in the above-described range, the mask blank is provided, which is capable of more reducing the variations in removed width, thereby preventing the dissolved resist from scattering outside the substrate, hitting against and rebounding from a cup provided outside the unnecessary film removing apparatus, thereby re-adhering to the cover member and the substrate, resulting in a defect.

(Structure 4) The resist liquid contains at least any one of propylene glycol monomethyl ether acetate, propylene glycol monomethyl ether, and methyl isoamyl ketone as the solvent, and the rotation speeds R1, R2, and R3 are set to be:

$$R1=400 \text{ to } 800 \text{ rpm} \quad (I)$$

$$R2\geq 500 \text{ rpm} \quad (II)$$

$$R1<R2\leq R3 \quad (III)$$

under which condition, the substrate is rotated.

When the resist liquid contains at least any one of propylene glycol monomethyl ether acetate, propylene glycol monomethyl ether, and methyl isoamyl ketone as the solvent, the viscosity of the resist (raw liquid) is generally set low to be 5 cp or less, and therefore easy to be dissolved by chemical liquid (fast in dissolving speed). Accordingly, even if the centrifugal force by rotation works, the chemical liquid is easily allowed to permeate into the center of the substrate. Therefore, the rotation speed R1 of the substrate of the resist containing the above-described solvent is set to be high compared with the resist of the structure 3.

Namely, if the rotation speed R1 of the substrate is set to be too low, the centrifugal force by rotation is weak, thereby allowing the chemical liquid to permeate into the center of the substrate, thereby forming the build-ups by swelling of the resist, to form the build-up parts. However, if the rotation speed R1 of the substrate is set to be too high, by surrendering to the centrifugal force by rotation, the chemical liquid can not be successfully permeated into every gap, and therefore the resist can not be dissolved.

In view of the above-described points, the rotation speed R1 of the substrate is set to be:

$$R1=400 \text{ to } 800 \text{ rpm}. \quad (I)$$

Also, if the rotation speed R2 of the substrate is set to be too low, the dissolved resist is allowed to permeate into the center of the substrate, thereby forming the build-ups by swelling of the resist, or the dissolved resist remains without being removed outside the substrate, thereby forming the resist residue.

Accordingly, when the resist contains the above-described solvents, the rotation speed R2 of the substrate is set to be:

$$R2\geq 500 \text{ rpm}. \quad (II)$$

In addition, with respect to the rotation speed R1 of the substrate, the rotation speed R2 of the substrate, and the rotation speed R3 of the substrate, R2 needs to be larger than R1 from the point that the resist dissolved by chemical liquid is not allowed to be kept in the peripheral edge of the substrate, but removed outside the substrate. Also, R3 may be equal to R2 or more from the point of preventing the dissolved resist remained without being completely removed outside the substrate, from permeating into the center of the substrate. Therefore, in view of the above points, the rotation speed R1 of the substrate, the rotation speed R2 of the substrate, and the rotation speed R3 are set to be:

$$R1<R2\leq R3. \quad (III)$$

(Structure 5) There is provided the manufacturing method of the mask blank according to structure 4, wherein the rotation speed R2 is set to be R2=500 to 900 rpm. By setting the rotation speed R2 in the above-described range, the mask blank is obtained, which is capable of more reducing the variations in removed width, thereby preventing the dissolved resist from scattering outside the substrate, hitting against and rebounding from a cup provided outside the unnecessary film removing apparatus, thereby re-adhering to the cover member and the substrate, resulting in a defect.

(Structure 6) There is provided the manufacturing method of the mask blank according to any one of the structures 2 to 5, wherein the rotation speed R3 is equal to 1000 rpm or more, and equal to 3000 rpm or less.

By setting the rotation speed R3 to be equal to 1000 rpm or more, the area from which the resist film is removed by chemical liquid can be dried quick, thereby improving throughput. Meanwhile, by setting the rotation speed R3 to be equal to 3000 rpm or less, the risk that the cover member is detached from the substrate can be avoided.

(Structure 7) There is provided the manufacturing method of the mask blank according to any one of the structures 1 to 6, wherein the gap is set to be the size large enough to allow the chemical liquid to flow thereinto through the gap and kept in the gap.

In the removed area of the main surface of the substrate, the gap formed between the cover member and the main surface of the substrate is set to be the size large enough to allow the chemical liquid to flow into the gap through the gap and kept only in the gap. With this structure, by an action of the surface tension of the chemical liquid, and an action of the centrifugal force by rotation of the substrate, the chemical liquid can be surely and exactly fed to a prescribed part of the main surface of the substrate.

(Structure 8) There is provided the manufacturing method of the mask blank according to any one of the structures 1 to 7, wherein the cover member covers the main surface formed with a space larger than the gap, in the non-resin-removed area other than the resin-removed area.

With this structure that cover member covers the main surface of the substrate, the thermal influence on the resist film by air current from the upside of the substrate can be prevented, and further by forming the space in the non-resin-removed area larger than the gap in the resin-removed area, the invasion of the chemical liquid into the non-resin-removed area can be prevented.

(Structure 9) There is provide the manufacturing method of the mask blank according to any one of the structures 1 to 8, wherein the chemical liquid is fed from the upside of the cover member, and fed to the unnecessary resist through the chemical liquid flowing path provided in the cover member.

Thus, by feeding the chemical liquid from the upside of the cover member to the unnecessary resist through the chemical liquid flowing path provided in the cover member, the unnecessary resist film can be removed, while the consumption of the chemical liquid is suppressed.

(Structure 10) There is provided the manufacturing method of the mask blank according to any one of the structures 1 to 9, wherein the chemical liquid feeding path for feeding the chemical liquid is provided in a position corresponding to the unnecessary resist film portion in the cover member, or a chemical liquid guide member is provided outside the cover member, and the chemical liquid flowing path is set to be between the cover member and the chemical liquid guide member.

Thus, by providing the chemical liquid feeding path for feeding the chemical liquid in the position corresponding to the unnecessary resist film portion, or providing the chemical liquid guide member outside the cover member, thereby setting the chemical liquid flowing path between the cover member and the chemical liquid guide member, the chemical liquid can be precisely fed to the unnecessary resist film portion, and therefore the removed area of the resist film can be strictly controlled.

(Structure 11) There is provided a manufacturing method of a transfer mask, wherein by using the mask blank obtained by the manufacturing method of the mask blank according to any one of the structures 1 to 10, the thin film is patterned to form a transfer pattern on the substrate.

By preparing the transfer mask using the mask blank obtained by the manufacturing method of the mask blank according to the structures 1 to 10, a good transfer pattern can be obtained, which is free of a pattern defect in the pattern formed in the peripheral edge of the substrate such as an alignment mark, QA pattern (quality assurance pattern), and a bar code pattern, caused by the build-ups after removing the resist film.

10 Substrate (mask blank)
11 (Transparent) substrate
12 Resist film
13a Unnecessary film
20 Turn table
21 Cover member
40 Nozzle
50 Chemical liquid
60 Thread

BEST MODE FOR CARRYING OUT THE INVENTION

Figure 1:
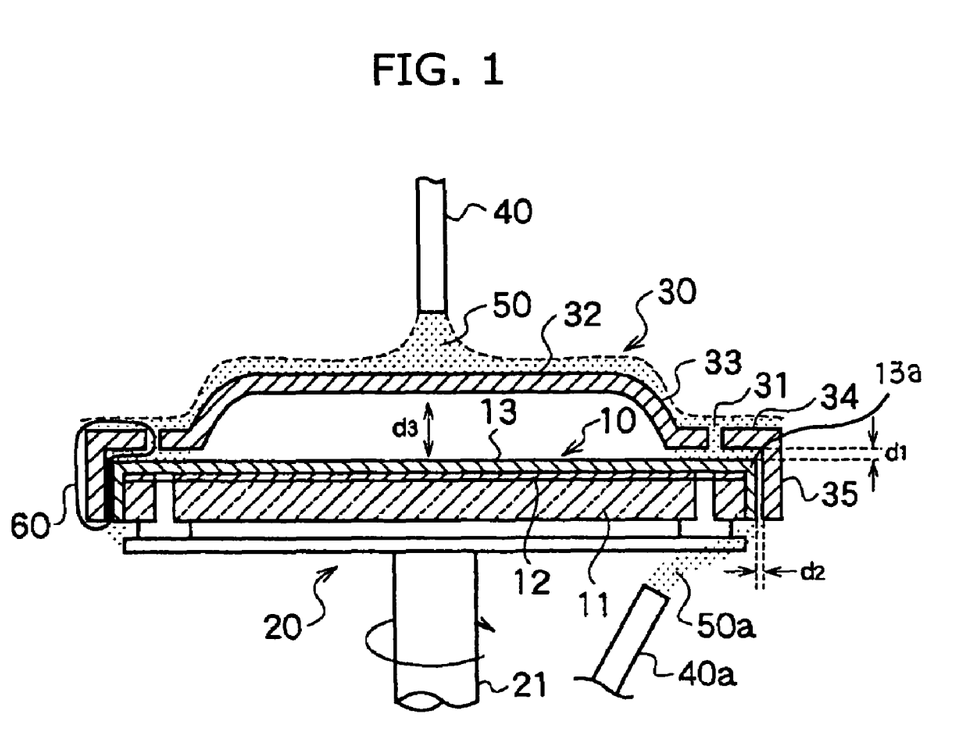
FIG. 1 is a side sectional view showing the structure of an unnecessary film removing apparatus used in an unnecessary film removing step relating to an embodiment.
Figure 2:
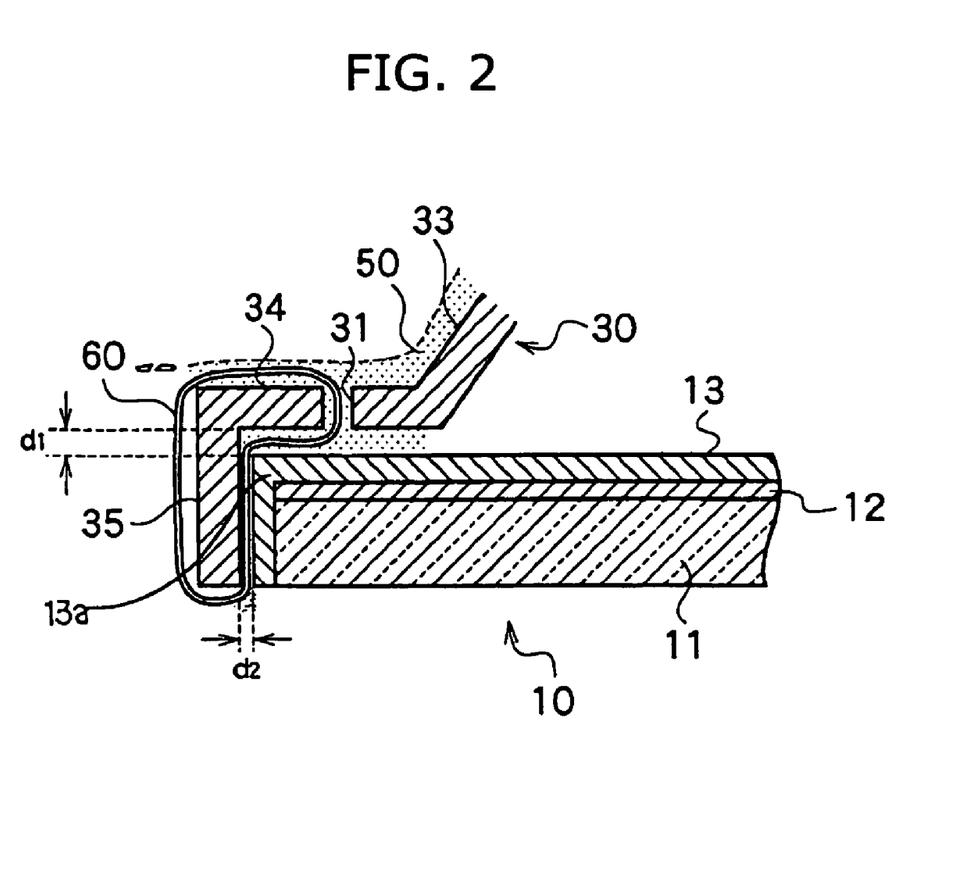
FIG. 2 is a partially enlarged sectional view of FIG. 1.
Figure 3:
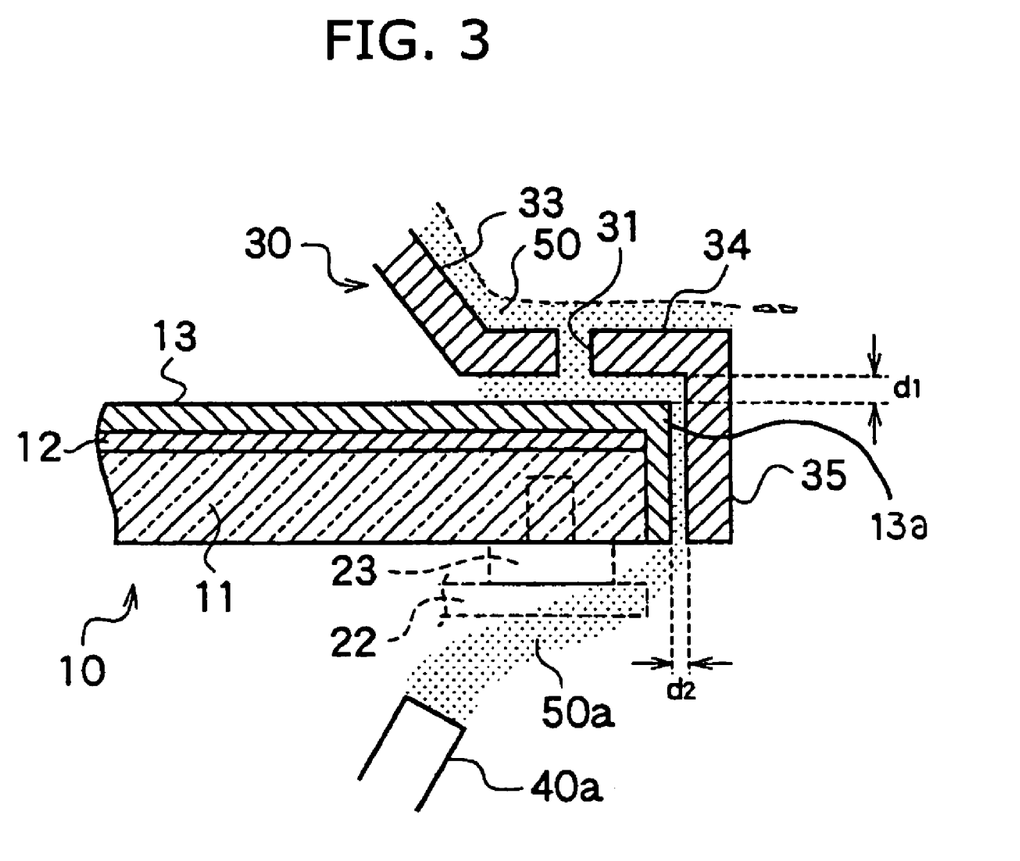
FIG. 3 is a partially enlarged sectional view of FIG. 1.
Figure 4:
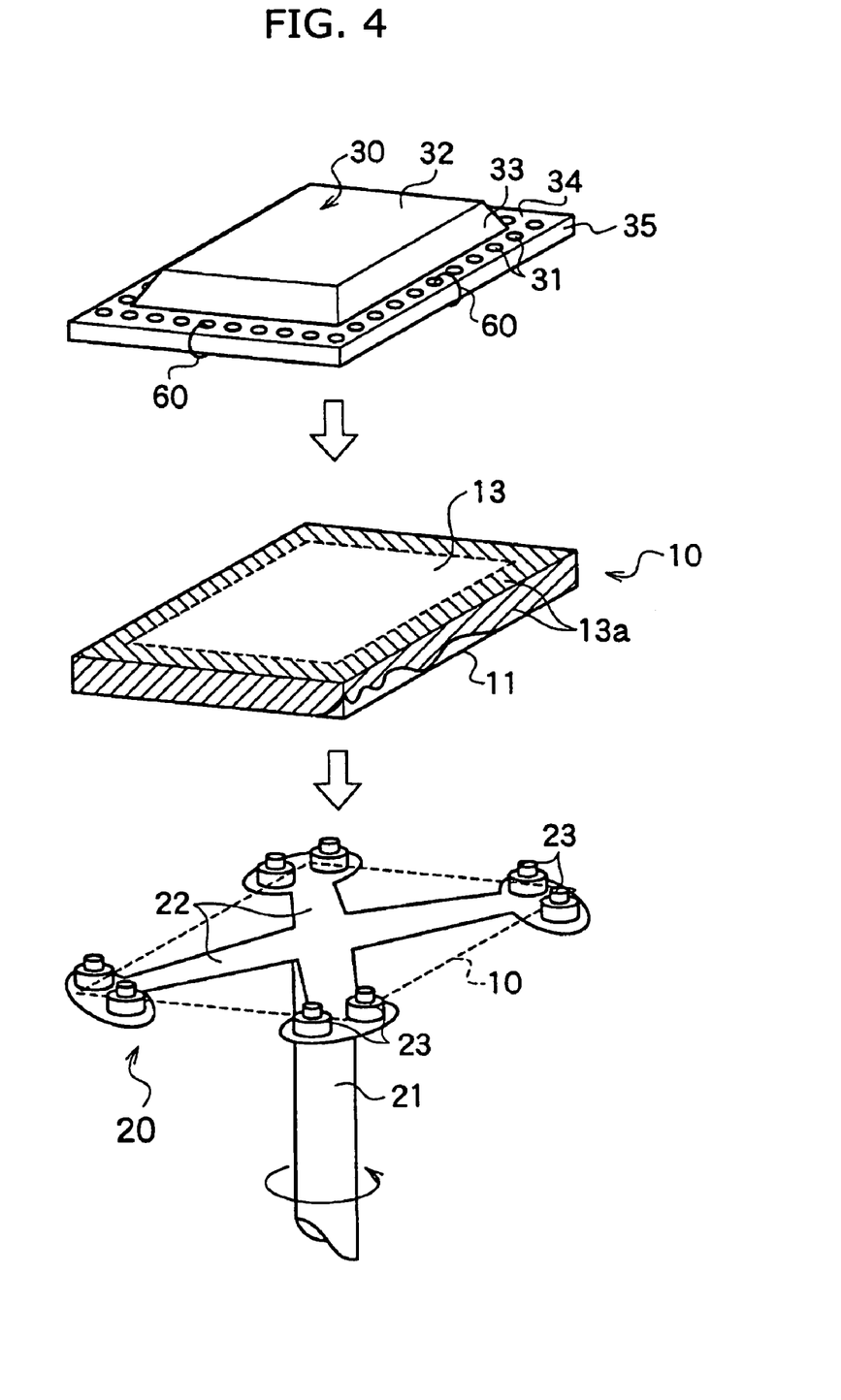
FIG. 4 is an exploded perspective view of the unnecessary film removing apparatus used in the unnecessary film removing step relating to the embodiment.
Figure 5:
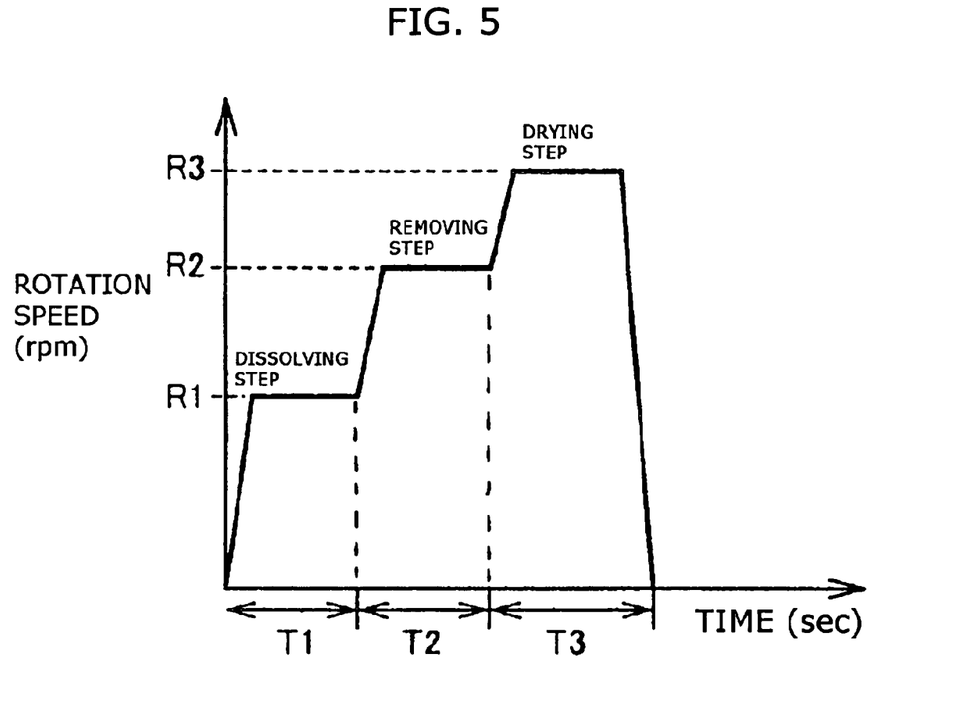
FIG. 5 is a graph showing a change in time of the rotation speed of the substrate relating to the embodiment.

Preferred embodiments of the present invention will be explained with reference to the drawings hereunder. FIG. 1 is a side sectional view showing the structure of an unnecessary film removing apparatus used in an unnecessary film removing step relating to an embodiment. FIG. 2 and FIG. 3 are partially enlarged sectional views of FIG. 1. FIG. 4 is an exploded perspective view of the unnecessary film removing apparatus used in the unnecessary film removing step relating to the embodiment. FIG. 5 is a graph showing the change in time of the rotation speed of a substrate relating to the embodiment, where the times are shown on the horizontal axis, and the rotation speed is shown on the vertical axis.

In FIG. 1 to FIG. 4, a substrate 10 is a mask blank in which a light-shielding film 12 formed of chrome is formed on the surface of a light-transmitting substrate (152.4 mm×152.4 mm×6.35 mm) 11 formed of synthetic quartz glass, and further on the light-shielding film 12, an unbaked resist film 13 of 4000 angstrom thickness is formed by a spin-coating method.

An upper surface side of the substrate 10 placed and held on a turntable 20 is covered by a cover member 30, and chemical liquid 50 that dissolves the resist film by a nozzle 40 from the upside of the cover member is ejected and fed to an unnecessary film part 13a through a chemical liquid feeding hole of the cover member 30, thereby dissolving the unnecessary part 13a.

The cover member 30 covers the substrate 10 in such a manner as to cover the substrate 10 from the upside, and a major part raging from the center to the peripheral edge is a flat section 32. An inclined section 33 is formed from the flat section 32 to the outer peripheral section, and from the inclined section 33 to further the outer peripheral section, a peripheral flat section 34 is formed. The outer peripheral edge of the peripheral flat section 34 is bent at an approximately right angle, and a side surface section 35 is formed.

In the peripheral flat section 34, chemical liquid feeding holes 31, which are a plurality of through holes, are formed. Regarding the chemical liquid feeding holes 31, suitable shape, size and forming gap are selected according to the viscosity, etc., of chemical liquid 50. Namely, a hole shape may be a square, a rectangle, a circular shape, an elliptical shape, and any other shape. The size of the hole is set to be large enough to allow the chemical liquid to be evenly fed to the unnecessary film 13a at a fixed feeding speed. In addition, the interval between each hole is set so that the chemical liquid fed from the chemical liquid feeding holes can spread all over the unnecessary film 13a without spacing.

The area on the substrate surface opposing to the inner wall of the flat section 32, which occupies a major part ranging from the center of the cover member 30 to the peripheral edge, is the area (area other than the unnecessary film 13a) of the necessary film 13. In this area, the gap between the inner wall of the cover member 30 and the surface of the substrate 10 is set to be larger than d1 as will be described later, so that the surface tension caused by chemical liquid does not work between the substrate surface and the cover member, and the gap is sized larger than the specified size, so that the temperature distribution of the resist film 13 may not be affected by heat transfer from the inner wall of the cover member 30, and in addition, the gap is sized smaller than the specified size, so that the temperature distribution is not generated in the resist film 13 on the main surface of the substrate by convection of gas which is generated in the gap.

As shown in FIG. 1 and FIG. 2, the size of the gaps is set by putting a thread 60 (for example, resin-based substance) having resistance to chemical liquid through several suitable parts of the chemical liquid feeding holes 31, so as to be interposed between the inner wall of the cover member 30 and the surface of the substrate 10, to set the size of the gaps. Specifically, the thread 60 passes through the chemical liquid feeding holes 31, passes between the inner wall of the peripheral flat section 34 and the surface of the substrate 10, and passes between the inner wall of the side surface section 35 and the side surface of the substrate 10, and further passes outside the side surface section 35 of the cover member 30, thereby forming the shape of loop.

The thickness of the thread 60 is set to be the size allowing the chemical liquid to be spread into the gap through the gap by the surface tension of the chemical liquid and the centrifugal force of the substrate, when feeding the chemical liquid into the gap d1 between the inner wall of the peripheral flat section 34 and the main surface of the substrate 10.

In addition, the size of the gap d2 between the inner wall of the side surface section 35 and the side surface of the substrate 10 may be the size allowing the chemical liquid to pass through while contacting the resist film.

Moreover, as shown in FIG. 1 and FIG. 3, a chemical liquid feeding nozzle 40a is provided under the substrate 10 also, and by feeding chemical liquid 50a from the nozzle 40a, the unnecessary resist film 13a can be surely removed.

In addition, regarding a turntable 20, a rotation axis 21, support arms 22, and holding pedestals 23, explanation will be given by using FIG. 4.

Based on FIG. 4, an appearance in which the substrate 10 is held by the turntable 20 will be explained. The substrate 10 is held by the turntable 20 by having arranged therein four support arms 22 attached to the rotation axis 21 and extended radially to the horizontal direction, and four corners of the substrate 1 on the holding pedestals 23 having a pair of holding pedestals 23 provided on the tip part of each support arm 22. The rotation axis 21 is connected to a rotation driving device not shown, and is rotated by a predetermined rotational frequency. The substrate 10 covered by the cover member 30 is held by the turntable 20 and processed while rotating. Note that signs and numerals used for explanation in FIGS. 1 to 3 are the same sings and numerals used for each part shown in FIG. 4.

Next, explanation will be given to an embodiment capable of manufacturing the mask blank without resist residues by suppressing the build-ups after removing the resist film on the peripheral edge of the substrate, even when using various kinds of resists.

(In a Case of a High-Molecular-Weight Resist)

The resist liquid of a high-molecular-weight resist contains at least one type of solvent selected from the group consisting of diethylene glycol dimethyl ether, anisole, methyl cellosolve acetate, and cyclohexanone as the solvent, the viscosity (raw liquid) of the resist is high to be set to be above 10 cp (above 40 cp sometimes), and therefore, it is difficult to be dissolved by the chemical liquid (slow in dissolving speed). Accordingly, for the chemical liquid to successfully permeate into every gap without surrendering to the centrifugal force by rotation, the rotation speed R1 of the substrate is preferably set to be low so as to allow the chemical liquid to successfully permeate into every gap.

However, if the rotation speed R1 of the substrate is set to be too low, the centrifugal force by rotation is weak, thereby allowing the chemical liquid to be permeated into the center of the substrate to form a swelling part in the resist, thus forming the build-up parts. However, if the rotation speed R1 of the substrate is set to be too high, by surrendering to the centrifugal force by rotation, the chemical liquid can not be successfully permeated into every gap, and therefore the resist formed on the peripheral edge of the substrate can not be completely dissolved.

Above-described points are taken into consideration, and the rotation speed R1 of the substrate in the resists containing the above-described solvents is preferably set to be:

(I) R1=100 to 500 rpm.

In addition, rotation time T1 of the substrate is a time till the resist is dissolved by the chemical liquid. T1 is preferably set to be 20 sec or more, and further preferably set to be 20 to 45 sec. If the time T1 is longer, although the resist residues are not generated, deterioration in throughput is not prevented, and further the sectional surface of the resist film after removing the resist on the peripheral edge of the substrate is exposed to chemical liquid for a long time, thus not preferably forming build-ups by swelling of the resist.

Moreover, if the rotation speed R2 is set to be too low, the dissolved resist is allowed to permeate into the center of the substrate, thereby forming the build-ups by swelling of the resist, or the dissolved resist remains without being removed outside the substrate, thereby forming the resist residues.

Accordingly, the rotation speed R2 of the substrate in the resist containing the above-described solvents is preferably set to be:

$$R2 \geq 300 \text{ rpm.} \quad (II)$$

In addition, from the viewpoint of preventing the dissolved resist from scattering outside the substrate, hitting against and rebounding from a cup provided outside the unnecessary film removing apparatus, thereby re-adhering to the cover member and the substrate, resulting in a defect, the rotation speed R2 of the substrate is preferably set to be 1000 rpm or less.

Further, from the viewpoint of reducing the variations in removed width in each side of the substrate caused by the difference in centrifugal force by rotation of the dissolved resist in a direction along each side of the peripheral edge of the main surface of the substrate, and preventing the defects caused thereby, the rotation speed R2 is preferably set to be R2=300 to 600 rpm.

Moreover, the rotation time T2 of the substrate is the time till the dissolved resist on the peripheral edge of the substrate is completely removed outside the substrate, and T2 is preferably set to be 10 sec or more.

If T2 is set to be too long, although the resist residues are not generated, the throughput is thereby deteriorated. Therefore T2 is preferably set to be 25 sec or less.

In addition, from the viewpoint that the rotation speed R3 of the substrate allows the resist dissolved by chemical liquid to be removed outside the substrate, without allowing it to be kept in the peripheral edge of the substrate, R2 must be set to be higher than R1. Also, from the viewpoint of preventing the resist not completely removed outside the substrate and remained, from permeating into the center of the substrate, R3 may be more than R2.

Therefore, the above-described viewpoints are taken into consideration, the rotation speed R1 of the substrate, the rotation speed R2 of the substrate, and the rotation speed R3 of the substrate are preferably set to be:

$$R1<R2 \leq R3. \tag{III}$$

Further, the rotation speed R3 of the substrate is preferably set to be 1000 rpm or more, so as to easily dry the area from which the resist is removed. However, if the rotation speed is set to be too high, with the cover member just covering the substrate and not fixing it, the cover member is possibly detached. Accordingly, the rotation speed is preferably set to be 3000 rpm or less, from the point of safety.

In addition, the rotation time T3 is the time required for completely drying the removed area on the peripheral edge of the substrate, and T3 is preferably set to be 30 sec or more.

(In a Case of the Resist Other Than High-Molecular-Weight Resist)

When the resist liquid contains at least one type of solvent selected from the group consisting of propylene glycol monomethyl ether acetate, propylene glycol monomethyl ether, methyl isoamyl ketone as a solvent, viscosity of the resist (raw material) is generally set to be low, to be 5 cp or less, and therefore such a resist liquid is easily dissolved by chemical liquid, compared with the above-described high-molecular-weight resist (fast in dissolving speed). Accordingly, even if the centrifugal force by rotation works, the chemical liquid easily permeates into the center of the substrate of the gap. Therefore the chemical liquid successfully permeates into every gap, and the rotation speed R1 of the substrate is adjusted so that the chemical liquid may not permeate into the center of the substrate.

Specifically, if the rotation speed R1 of the substrate is set to be too low, the centrifugal force by rotation is weak, therefore the chemical liquid permeates into the center of the substrate, and build-ups are formed by swelling of the resist. However, if the rotation speed R1 is set to be too high, by surrendering to the centrifugal force by rotation, the chemical liquid can not successfully permeate into the gap, and therefore the resist can not be successfully dissolved.

The above-described points are taken into consideration, and the rotation speed R1 of the substrate in the resist containing the above-described solvents is preferably set to be:

$$R1=400 \text{ to } 800 \text{ rpm}. \tag{I}$$

Also, the rotation time T1 of the substrate is the time required for dissolving the resist by chemical liquid, and T1 is preferably set to be 5 sec or more, and further preferably set to be 5 to 25 sec. If T1 is set to be too long, although the resist residues are not generated, deterioration in throughput is not prevented, and further the sectional surface of the resist film after the resist on the peripheral edge of the substrate is removed is exposed to chemical liquid for a long time, thus not preferably forming build-ups by swelling of the resist.

In addition, if the rotation speed R2 of the substrate is set to be too low, the dissolved resist permeates into the center of the substrate, and therefore build-ups are formed by swelling of the resist, or the dissolved resist is remained without being removed outside the substrate, thereby forming resist residues.

Accordingly, the rotation speed R2 of the substrate in the resist containing the above-described solvents is preferably set to be:

$$R2=500 \text{ rpm}. \tag{II}$$

In addition, the rotation speed R2 is preferably set to be 1000 rpm or less, from the point of preventing the dissolved resist from scattering toward outside the substrate, hitting against and rebounding from the cup provided in the outside the unnecessary film removing apparatus, and thereby re-adhering to the cover member and the substrate.

Further, the rotation speed R2 is preferably set to be R2=500 to 900 rpm, from the point of reducing the variations in removed width in each side of the substrate caused by the difference in the centrifugal force by rotation of the dissolved resist film in a direction along each side of the peripheral edge of the main surface of the substrate, and thereby preventing the defect caused by the peeled resist.

Also, the rotation time T2 of the substrate is the time required for completely removing the dissolved resist on the peripheral edge or the substrate outside the substrate, and T2 is preferably set to be 3 sec or more.

If the time of T2 is set to be too long, although the resist residues are not generated, the deterioration in throughput is invited, and therefore, T2 is preferably set to be 20 sec or less.

Also, regarding the rotation speed R1 of the substrate, the rotation speed R2 of the substrate, and the rotation speed R3 of the substrate, R2 must be larger than R1, from the point of removing the dissolved resist by chemical liquid outside the substrate without allowing it to be kept in the peripheral edge of the substrate. In addition, R3 may be equal to R2 or more, from the point of preventing the dissolved resist remained without completely being removed outside the substrate, from permeating into the center of the substrate. Therefore, the above-described points are taken into consideration, and the rotation speed R1 of the substrate, the rotation speed R2 of the substrate, and the rotation speed R3 of the substrate are preferably set to be:

$$R1<R2 \leq R3. \tag{III}$$

Further, the rotation speed R3 of the substrate is preferably set to be 1000 rpm or more so as to easily dry the resist-removed area. If the rotation speed is raised too high, with the cover member just covering the substrate and not fixing it, the cover member is possibly detached. Accordingly, from the point of safety, the rotation speed is preferably set to be 3000 rpm or less.

In addition, the rotation time T3 is the time required for completely drying the removed area on the peripheral edge of the substrate, and therefore T3 is preferably set to be 20 sec or more.

(Common Feature Between High-Molecular-Weight Resist and the Other Resist)

The gap formed between the cover member and the main surface of the substrate in the resist-removed area of the main surface of the substrate, is preferably set to be the size allowing the chemical liquid to flow into the gap through the gap and kept only in the gap. Thus, by the action of the surface tension of the chemical liquid and the centrifugal force by rotation of the substrate, the chemical liquid can be surely and correctly fed to a prescribed part of the main surface of the substrate. The gap is set to be the size within a range from 0.05 mm to 3 mm. If the size of the gap is under 0.05 mm or beyond 3 mm, it becomes difficult for the chemical liquid to be spread into the gap through the gap, thereby forming a part that can not be removed or forming nicks at the boundary between the removed part and the other part.

Therefore, by using the mask blank obtained by the above-described manufacturing method of the mask blank and thereby preparing the transfer mask, there can be obtained a good transfer pattern without pattern defects caused by the build-ups after removing the resist film in the pattern formed on the peripheral edge of the substrate such as an alignment mark, QA pattern (quality assurance pattern), and a bar code pattern.

(Example of a High-Molecular-Weight Resist)

As the resist containing at least one type of solvent selected from the group consisting of diethylene glycol dimethyl ether, anisole, methyl cellosolve acetate, and cyclohexanone as the solvent, generally the high-molecular-weight resist is given as an example. The resist whose molecular weight is within a range from several ten thousands to several hundred thousands is referred to as the high-molecular-weight resist. As the resist available on the market, ZEP series (produced by NIPPON ZEON), PBS series (produced by CHISSO), EBR series (produced by TORAY IND INC), and OEBR series (produced by TOKYO OHKA KOGYO CO LTD) are given as examples.

(Example of the Resist Other than High-Molecular-Weight Resist)

As the resist containing at least one type of solvent selected from the group consisting of propylene glycol monomethyl ether acetate, propylene glycol monomethyl ether, and methyl isoamyl ketone as the solvent, a chemically liquidly amplified resist is given as a typical example. As the chemically liquidly amplified resist, which is available on the market, FEP series (produced by FUJIFILM ARCH), NEB series (produced by Siplay Co. Ltd), and AZ series (produced by Hoechst A.G.) are given as examples.

(Chemical Liquid Path and an Example of Chemical Liquid)

Moreover, as the above-described chemical liquid path, chemical liquid feeding holes for feeding chemical liquid may be formed in a position corresponding to the unnecessary resist film in the cover member to select it as the chemical liquid feeding path. In addition, as the chemical liquid path, a chemical liquid guide member may be formed outside the cover member to select the chemical liquid feeding path between the cover member and the chemical liquid guide member.

Further, the chemical liquid may be anything, provided that the resist can be dissolved thereinto. For example, it is possible to use the solvents such as ketone, ester, aromatic hydrocarbon, halogenated hydrocarbon, and ether, into which the resist can be dissolved. In addition, in an alkali developing type resist, an alkali developing liquid can be used as a chemical liquid.

(Mask Blank)

The mask blank specified in the present invention refers to either of a transmission type mask blank or a reflective mask blank. In the above mask blanks, the thin film becoming a transfer pattern to be transferred to a body to be transferred and the resist film are formed on the substrate.

The transmission type mask blank is a photo mask blank using a light-transmission type substrate for the substrate, and using a thin film by which an optical change is made to the exposure light (for example, the thin film having a light-shielding function) used when transferring to the body to be transferred, for the thin film becoming the transfer pattern. Here, the thin film that makes optical change to the exposure light means the light-shielding film that shields the exposure light, and a phase shifting film that changes the phase difference of the exposure light.

Also, the thin film having the light-shielding function includes a halftone film having the light-shielding function and the phase shifting function.

Accordingly, the transmission type mask blank includes a photo mask blank formed with the light-shielding film, a halftone phase shifting mask blank formed with the halftone film, and a phase shifting mask blank formed with the phase shifting film.

In addition, the reflective mask blank is a mask blank in which a low expansion substrate is used as a substrate, and on the substrate, a light-reflecting multiple layer film and a light absorbing film becoming the transfer pattern are formed.

In addition, in the mask blank, other than the above-described films, the films such as a resist bottom anti-reflective film (BARC: Bottom Anti-Reflective Coating), a resist top anti-reflective film (TARL: Top Anti-Reflective Layer), a resist top protective film, and a conductive film may be formed.

Hereunder, embodiments of the manufacturing method of the mask blank using the above-described unnecessary film removing apparatus will be explained with reference to FIG. 5.

Moreover, in the embodiments, tables 1 and 2 show the rotation speed and rotation time in each step of dissolving, removing, and drying steps, and evaluation results of resist residues and build-ups after executing each step. Note that in the table 1 and the table 2, "o" in a resist residue section shows that no resist residues could be checked in the remove-area of the resist film by observation using a microscope, and "x" shows that the resist residues could be checked. Also, "o" in a build-up section shows that no pattern defect could be checked when measuring the sectional surface of the removed resist film 13 with the above-described tracer type film thickness measuring apparatus and manufacturing the transfer mask thereafter, and "x" shows that the pattern defect could be checked. Note that the pattern defect was generated when the measurement result showed the maximum film thickness beyond 15000 angstrom.

Incidentally, in the following embodiments, for simplifying the explanation, the dissolving step refers to the step in which the function to dissolve is large, the removing step refers to the step in which the function to remove the dissolved resist film outside the substrate by rotation of the substrate, and the drying step refers to the step in which the function to dry the removed area is large. However, each of the above-described steps includes the case in which other function works.

Embodiment 1

In this embodiment, methyl cellosolve acetate (MCA) was used as the resist liquid to be applied on the thin film by using high-molecular-weight resist containing MCA (PBS: produced by CHISSO) as a solvent, and MCA was used as chemical liquid.

First, the substrate 10 is set on the turntable 20 and covered with the cover member 30, and then the chemical liquid 50 is fed thereto from the nozzle 40 while adjusting the feeding amount. At the same time, the turntable 20 is rotated with rotation speed R1 set at 250 rpm and rotation time T1 set at 30 seconds. Thus, the chemical liquid 50 permeates into the unnecessary film 13a through the chemical liquid feeding holes 31 to thereby dissolve the unnecessary film 13a. (dissolving step)

Next, feeding of the chemical liquid 50 from the nozzle 40 is stopped, and the turntable 20 is rotated with rotation speed R2 set at 450 rpm and rotation time T2 set at 20 seconds. Thus, the unnecessary film of the dissolved resist is removed outside the substrate. (removing step)

Next, the turntable 20 is rotated with the rotation speed R3 set at 1000 rpm and rotation time set at 40 seconds. Thus, the area from which the unnecessary film 13a is removed is dried.

(Drying Step)

Next, the substrate 10 is taken out of the unnecessary film removing apparatus, then subjected to heat treatment (baking treatment) to thereby obtain the mask blank having resist film from which the resist film 13 is removed. Note that the removed width of the resist film of the main surface of the substrate on the side formed with the light-shielding film is within 1.5 mm±0.3 mm, and variations in the removed width is small to form a uniform width. The average thickness of the resist film was a little less than about 4000 angstrom.

The area from which the resist film was removed was checked by an electron microscope, to confirm a good condition without resist residues.

In addition, the sectional face of the resist film 13 thus removed was measured by using the stylus type film thickness measuring apparatus (produced by TAYLOR HOBSON LTD), to confirm about 4500 angstrom maximum film thickness and about 500 angstrom build-up. When the transfer mask is prepared by using the mask blank thus formed, defects in patterns caused by the build-ups of the resist film 13 and defects caused by generation of dust did not occur. The aforementioned results are shown in table 1.

Embodiments 2 to 3, and Comparative Examples 1 to 5

In table 1, the rotation speed and rotation time are defined as R2 and T1 respectively in the dissolving step, and the rotation speed and rotation time are defined as R3 and T3 respectively in the drying step. Other conditions are set same as the embodiment 1, to form a mask blank.

As shown in table 1, in the dissolving step of the unnecessary film, the embodiments 1 to 3 revealed a good transfer pattern, in which the rotation speed of the substrate in the dissolving step, the removing step, and the drying step was within the scope of the present invention, without having no resist residues generated and confirming no pattern defects due to the build-ups of the sectional surface of the resist film.

Meanwhile, the comparative example 1 revealed a defective pattern, in which chemical liquid permeated into the inside of the gap formed between the cover member and the main surface of the substrate (unnecessary film 13a) due to low rotation speed R1 of the substrate in the dissolving step, thereby enlarging the build-ups of the sectional surface of the resist film.

In addition, the comparative example 2 revealed resist residues generated, in which the chemical liquid did not successfully permeate into the gap formed between the cover member and the main surface of the substrate (unnecessary film 13a) due to high rotation speed R1 in the dissolving step.

Further, the comparative examples 3 and 4 revealed a defective pattern, in which the resist dissolved in the dissolving step was not quickly removed and remained, thereby generating resist residues and enlarging the build-ups of the sectional surface of the resist film.

Moreover, the comparative example 5 revealed a defective pattern with not large build-ups of the sectional surface of the resist film, in which the rotation speed R3 of the substrate in the drying step was lower than the rotation speed R2 of the substrate in the removing step, and therefore the resist remained without being completely removed outside the substrate permeated into the inside of the substrate and further remained without being removed outside the substrate to generate the resist residues.

Embodiments 4 to 6, Comparative Examples 6 to 10

As for the resist liquid to be applied on the thin film, this embodiment used a chemical amplification type resist (FEP171: produced by FUJIFILM ARCH) containing propylene glycol monomethyl ether acetate (PGMEA) and propylene glycol monomethyl ether (PGME) as a solvent, and also used mixed solution of PGMEA (propylene glycol monomethyl ether acetate) and PGME (propylene glycol monomethyl ether) as a chemical liquid.

TABLE 1

|  | DISSOLVING STEP | | REMOVING STEP | | DRYING STEP | | | |
| --- | --- | --- | --- | --- | --- | --- | --- | --- |
|  | ROTATION SPEED R1 (rpm) | ROTATION TIME T1 (Sec) | ROTATION SPEED R2 (rpm) | ROTATION TIME T2 (Sec) | ROTATION SPEED R3 (rpm) | ROTATION TIME T3 (Sec) | RESIST RESIDUES | BUILD-UPS |
| EMBODIMENT 1 | 250 | 30 | 450 | 20 | 1000 | 40 | ○ | ○ |
| EMBODIMENT 2 | 100 | 20 | 300 | 25 | 1000 | 60 | ○ | ○ |
| EMBODIMENT 3 | 500 | 45 | 1000 | 8 | 1200 | 30 | ○ | ○ |
| COMPARATIVE EXAMPLE 1 | 80 | 15 | 300 | 25 | 1000 | 60 | ○ | X |
| COMPARATIVE EXAMPLE 2 | 520 | 60 | 300 | 25 | 1000 | 60 | X | ○ |
| COMPARATIVE EXAMPLE 3 | 250 | 30 | 280 | 40 | 1000 | 60 | X | X |
| COMPARATIVE EXAMPLE 4 | 250 | 30 | 250 | 60 | 1000 | 60 | X | X |
| COMPARATIVE EXAMPLE 5 | 250 | 30 | 300 | 25 | 250 | >90 | X | X |

Then, the mask blank was manufactured in the same way as the embodiment 1, other than the rotation speed R1 and the rotation time T1 in the dissolving step, the rotation speed R2 and the rotation time T2 in the removing step, and the rotation speed R3 and the rotation time T3 in the drying step, which were specified as conditions shown in table 2.

TABLE 2

|  | DISSOLVING STEP | | REMOVING STEP | | DRYING STEP | | RESIST RESIDUES | BUILD-UPS |
|---|---|---|---|---|---|---|---|---|
|  | ROTATION SPEED R1 (rpm) | ROTATION TIME T1 (Sec) | ROTATION SPEED R2 (rpm) | ROTATION TIME T2 (Sec) | ROTATION SPEED R3 (rpm) | ROTATION TIME T3 (Sec) | | |
| EMBODIMENT 4 | 500 | 15 | 750 | 10 | 1500 | 25 | ○ | ○ |
| EMBODIMENT 5 | 400 | 5 | 500 | 20 | 1200 | 30 | ○ | ○ |
| EMBODIMENT 6 | 800 | 20 | 1000 | 5 | 1000 | 40 | ○ | ○ |
| COMPARATIVE EXAMPLE 6 | 380 | 5 | 500 | 20 | 1200 | 30 | ○ | X |
| COMPARATIVE EXAMPLE 7 | 820 | 30 | 500 | 20 | 1200 | 30 | X | ○ |
| COMPARATIVE EXAMPLE 8 | 400 | 5 | 480 | 30 | 1200 | 30 | X | X |
| COMPARATIVE EXAMPLE 9 | 500 | 15 | 500 | 35 | 1200 | 30 | X | X |
| COMPARATIVE EXAMPLE 10 | 400 | 15 | 500 | 20 | 400 | >60 | X | X |

As shown in table 2, in the unnecessary film removing step, the embodiments 4 to 6, in which the rotation speed of the substrate in the dissolving step, the removing step, and the drying step was within the scope of the present invention, revealed the good transfer pattern without having the resist residues generated and confirming the defective pattern due to the build-ups of the sectional surface of the resist.

Meanwhile, the comparative example 6 revealed the defective pattern, in which the chemical liquid permeated into the inside of the gap formed between the cover member and the main surface of the substrate (unnecessary film 13a) due to low rotation speed R1 of the substrate in the dissolving step, thereby enlarging the build-ups of the sectional surface of the resist.

Further, the comparative example 7 revealed the resist residues generated, in which the chemical liquid did not successfully permeate into the gap formed between the cover member and the main surface of the substrate (unnecessary film 13a) due to the high rotation speed R1 in the dissolving step, thereby generating the resist residues.

In addition, the comparative examples 8 and 9 revealed the defective pattern, in which the resist dissolved in the dissolving step was remained without being quickly removed outside the substrate due to the low rotation speed R2 of the substrate in the removing step, to generate the resist residues and enlarge the build-ups of the sectional surface of the resist film.

Moreover, the comparative example 10 revealed the defective pattern, in which the rotation speed R3 of the substrate in the drying step was lower than the rotation speed R2 of the substrate in the removing step and therefore the resist dissolved and remained without being completely removed outside the substrate permeated into the inside of the substrate and remained without being removed outside the substrate, with not large build-ups of the sectional surface of the resist film.

Next, relation between the rotation speed R2, variations in the removed width, and existence of defects due to re-adhesion of the dissolved resist was examined.

Embodiments 7 and 8

In the embodiment 1, the mask blank was manufactured in the same way as the embodiment 1, other than setting the rotation speed R1 to 300 rpm, setting the rotation time T1 to 35 seconds in the dissolving step, setting the rotation speed R2 to 600 rpm, setting the rotation time T2 to 15 seconds in the removing step, and setting the rotation speed R3 to 1200 rpm, and setting the rotation time T3 to 40 seconds in the drying step (Embodiment 7).

In addition, the mask blank was manufactured in the same way as the embodiment 4 other than setting the rotation speed R1 to 600 rpm, setting the rotation time T1 to 15 seconds in the dissolving step, setting the rotation speed R2 to 900 rpm, setting the rotation time t2 to 10 seconds in the removing step, and setting the rotation speed R3 to 1800 rpm, setting the rotation time T3 to 20 seconds in the drying step (Embodiment 8).

When the variations in removed width of the resist film was examined for the embodiments 1, 2, 3, and 7, in the case of using the aforementioned high-molecular-weight resist, the variations were within 1.5±0.3 mm, to find uniform removed width with small variations. Further, in the embodiment 3, since the rotation speed R2 was high, the removed width in the corner part of the substrate became larger to be 1.0 (minimum removed width) to 2.0 mm (maximum removed width) (1.5±0.5 mm). Also, the defect-inspecting apparatus did not find the defect due to re-adhesion of the resist on the surface of the substrate.

When the variations in removed width of the resist film was examined for the embodiments 4, 5, 6, and 8, in the case of using the aforementioned chemical amplification resist, the variations were within 1.5±0.3 mm, to find the uniform removed width with small variations. Further, in the embodiment 6, since the rotation speed R2 was high, the removed width in the corner part of the substrate became larger to be 0.8 (minimum removed width) to 2.2 mm (maximum removed width) (1.5±0.7 mm). Also, the defect-inspecting apparatus did not find the defect due to the re-adhesion of the resist on the surface of the substrate.

Effects shown in the aforementioned embodiments could also be confirmed in ZEP series (produced by NIPPON ZEON), EBR series (produced by TORAY IND INC), OEBR series (produced by TOKYO OHKA KOGYO CO LTD), which are high-molecular-weight resists containing at least one type of solvent selected from the group consisting of diethylene glycol dimethyl ether, anisole, methyl cellosolve acetate, and cyclohexanone as the solvent, and also in NEB series (produced by Siplay Co. Ltd), SAL series (produced by Siplay Co. Ltd), AZ series (produced by HOECHST), which are resists containing at least one type of solvent selected from propylene glycol monomethyl ether acetate, propylene glycol monomethyl ether, and methyl isoamyl ketone as the solvent.

From the aforementioned results, the rotation speeds R1, R2, and R3 of the substrate in the dissolving step, the removing step, and the drying step of the unnecessary film removing steps were set to be R1=100 to 500 rpm, R2≧300 rpm, satisfying R1<R2≦R3, in the case of using the resist containing at least one type of solvent selected from the group consisting of diethylene glycol dimethyl ether, anisole, methyl cellosolve acetate, and cyclohexanone as the solvent. Meanwhile, the rotation speeds R1, R2, and R3 were set to be R1=400 to 800 rpm, R2≧500 rpm, satisfying R1<R2≦R3 in the case of using the resist containing at least one type of solvents selected from propylene glycol monomethyl ether acetate, propylene glycol monomethyl ether, and methyl isoamyl ketone as the solvent. Whereby, the build-ups generated after removing the resist film on the peripheral edge of the substrate could be suppressed and also the mask blank without resist residues could be obtained, and further the transfer mask without defective patterns could be obtained.

Further, in the case of using the resist including any one of the resist containing at least one type of solvent selected from the group consisting of diethylene glycol dimethyl ether, anisole, methyl cellosolve acetate, and cyclohexanone, by setting the rotation speed R2 so as to satisfy the equation, R2=300 to 600 rpm, and also, in the case of using the resist containing at least one type of solvent selected from propylene glycol monomethyl ether acetate, propylene glycol monomethyl ether, and methyl isoamyl ketone as the solvent, by setting the aforementioned rotation speed R2 so as to satisfy the equation, R2=500 to 900 rpm, the mask blank capable of reducing the variations in removed width in each side of the substrate, and also preventing the defect caused by the re-adhesion of the dissolved resist could be obtained.

Note that in the aforementioned embodiments, the dissolving step, the removing step, and the drying step was respectively conducted once. However, as other examples, the dissolving step, the removing step, and the drying step may be repeated plural times. Processing in the case of repeating each step plural times, will be explained with reference to FIG. 6.

Figure 6:
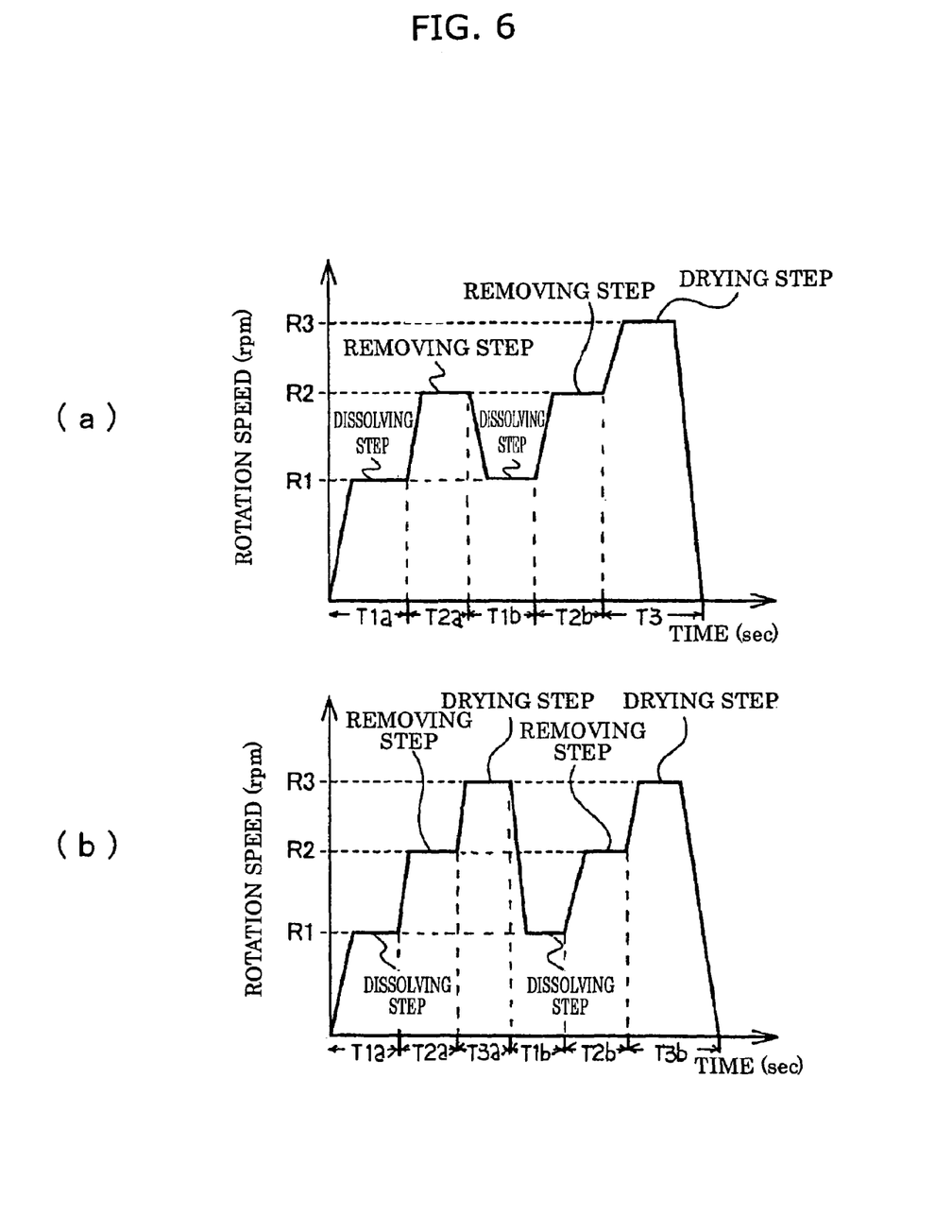
FIG. 6 is a graph showing the change in time of the rotation speed of the substrate in other applied example.

FIG. 6 is a graph showing a change in time of the rotation speed of the substrate according to the embodiment, where the times are shown on the horizontal axis, and the rotation speed is shown on the vertical axis. FIG. 6(a) shows a case conducting a series of dissolving step→removing step→drying step→dissolving step→removing step→drying step, and FIG. 6(b) shows a series of dissolving step→removing step dissolving step→removing step→drying step.

When each processing is repeated plural times, as shown in FIG. 6(a), the series of steps may be dissolving step→removing step→drying step→dissolving step→removing step→drying step, or as shown in FIG. 6(b), the series of steps may be dissolving step→removing step→dissolving step→removing step→drying step, where the drying step is conducted in only the last. When the rotation time T1 (dissolving step), the rotation time T2 (removing step), the rotation time T3 (drying step) of the substrate are repeated plural times, the rotation time indicates total rotation time of each step in the unnecessary film removing step. Specifically, in FIG. 6(a), if the series of the steps is dissolving step (the rotation speed R1, rotation time T1a)→removing step (the rotation speed R2, rotation time T2a)→drying step (the rotation speed R3, rotation time T3a)→dissolving step (the rotation speed R1, rotation time T1b)→removing step (the rotation speed R2, rotation time T2b)→drying step (the rotation speed R3, rotation time T3), equations are expressed by T1=T1a+T1b, and T2=T2a+T2b. The same thing can be said for FIG. 6(b)also. Note that the equation, T3=T3a+T3b is established.

By repeating each processing plural times, preferably sectional shape of the resist film after removing the unnecessary film becomes good. Note that if the processing is repeated plural times, preferably the processing is repeated 2 to 5 times.

Note that a specific resist is explained as an example in the aforementioned embodiments, however the resist applicable to the present invention is not limited thereto. Any resist including the high-molecular-weight resist and the chemical amplification resist other than the above-described resist may be applied, and whichever of positive type or negative type may be applied.

Also, in the aforementioned embodiments, the unnecessary film removing step was conducted before the heat treatment step. However, if the unnecessary film can be removed by chemical liquid even after heat treatment, the unnecessary film removing step may be conducted after the heat treatment step.

Also, in the aforementioned embodiments, the cover member covering the surface of the substrate is given as an example. However, the cover member is not limited thereto, and any cover member may be used if a fixed gap is formed in the removed area in the main surface of the substrate. Also, the cover member may be structured so that a prescribed part corresponding to a non-removed area of the cover member (which may be the part corresponding to the entire part of the non-removed area) is opened.

INDUSTRIAL APPLICABILITY

According to a method of manufacturing a mask blank of the present invention, the mask blank capable of suppressing the build-ups after removing the resist film on the peripheral edge of the substrate and free of resist residues can be obtained even if using any resist kinds. In addition, even if using any resist kinds, the mask blank capable of suppressing the build-ups after removing the resist film on the peripheral edge of the substrate, free of resist residues, further capable of suppressing variations in removed width, and capable of preventing defects due to re-adhesion of the dissolved resist, can be obtained. Therefore, a transfer mask manufactured by using the mask blank manufactured by this manufacturing method is also capable of preventing a defective pattern in an auxiliary pattern formed near the peripheral edge of the substrate.

The invention claimed is:
1. A method of manufacturing a mask blank, comprising:
preparing a rectangular substrate formed with a thin film becoming a transfer pattern to be transferred to a body to be transferred, and also formed with a resist film by applying resist liquid on the thin film and drying the resist film thus applied;
removing an unnecessary resist film formed in a removed area provided on a peripheral edge of a main surface of the substrate by using chemical liquid; and
heating the resist film formed in a non-removed area which is a main surface of the substrate and an area other than the removed area, wherein in the unnecessary film removing step, a cover member is disposed in a main surface of the substrate formed with the resist film so as to form a prescribed gap with a main surface of the substrate in the removed area, further the substrate is rotated at the rotation speed R1 to dissolve the unnecessary resist film by feeding the chemical liquid in the gap, thereafter, the feeding of the chemical liquid is stopped, further the substrate is rotated at the rotation speed higher than the prescribed rotation speed, and the unnecessary resist film thus dissolved is removed outside the substrate, wherein the substrate is rotated when removing the dissolved unnecessary resist film outside the substrate and drying the area from which the resist film is removed, at the rotation speed R2 capable of suppressing variations in removed width in each side of the substrate, the variation being caused by the difference in centrifugal force applied on the dissolved resist film in a direction along each side of the peripheral edge of the main surface of the substrate, and thereafter, the substrate is rotated at a prescribed rotation speed R3 so as to dry the area from which the resists film is removed.

2. The method of manufacturing the mask blank according to claim 1, wherein the resist liquid contains at least one type of solvent selected from the group consisting of diethylene glycol dimethyl ether, anisole, methyl cellosolve acetate, and cyclohexanone as a solvent, and the rotation speeds R1, R2, and R3 are expressed by:

$$R1 = 100 \text{ to } 500 \text{ rpm} \quad (I)$$

$$R2 \geq 300 \text{ rpm} \quad (II)$$

$$R1 < R2 \leq R3 \quad (III).$$

3. The method of manufacturing the mask blank according to claim 2, wherein the rotation speed R2 is expressed by R2=300 to 600 rpm.

4. The method of manufacturing the mask blank according to claim 2, wherein the rotation speed R3 is expressed by R3≧1000 rpm and R3≦3000 rpm.

5. The method of manufacturing the mask blank according to claim 1, wherein the resist liquid contains at least one type of solvent selected from the group consisting of propylene glycol monomethyl ether acetate, propylene glycol monomethyl ether, and methyl isoamyl ketone as a solvent, and the rotation speeds R1, R2, and R3 are expressed by:

$$R1 = 400 \text{ to } 800 \text{ rpm} \quad (I)$$

$$R2 \geq 500 \text{ rpm} \quad (II)$$

$$R1 < R2 \leq R3 \quad (III).$$

6. The method of manufacturing the mask blank according to claim 5, wherein the rotation speed R2 is expressed by R2=500 to 900 rpm.

7. The method of manufacturing the mask blank according to claim 1, wherein the gap is set in a size allowing the chemical liquid to flow into the gap through the gap and retained only in the gap.

8. The method of manufacturing the mask blank according to claim 1, wherein the cover member covers the main surface formed with a larger space than the gap in the non-removed area other than the removed area.

9. The method of manufacturing the mask blank according to claim 1, wherein the chemical liquid is fed from upside of the cover member to be fed into the unnecessary resist film through a chemical liquid path provided in the cover member.

10. The method of manufacturing the mask blank according to claim 1, wherein the chemical liquid path is defined as a chemical liquid feeding path for feeding the chemical liquid to a position corresponding to the unnecessary resist film portion in the cover member, or as a chemical liquid path between the cover member and a chemical liquid guide member by providing the chemical liquid guide member outside the cover member.

11. A method of manufacturing a transfer mask, wherein a transfer pattern is formed on the substrate by using the mask blank obtained by using the method of manufacturing the mask blank according to claim 1 and by patterning the thin film.

* * * * *

UNITED STATES PATENT AND TRADEMARK OFFICE
CERTIFICATE OF CORRECTION

PATENT NO. : 7,354,860 B2  
APPLICATION NO. : 10/544988  
DATED : April 8, 2008  
INVENTOR(S) : Mitsuaki Hata It is certified that error appears in the above-identified patent and that said Letters Patent is hereby corrected as shown below:

<u>Title page</u>  
Item [75], change "Shinjuku-ku" to --Tokyo--.

Signed and Sealed this

Eighth Day of July, 2008

JON W. DUDAS  
*Director of the United States Patent and Trademark Office*